United States Patent
Seow et al.

(10) Patent No.: US 8,027,160 B2
(45) Date of Patent: Sep. 27, 2011

(54) HEAT SINK INCLUDING EXTENDED SURFACES

(75) Inventors: Thoong Hung Seow, Parker, TX (US); Sanjoy Kumar Saha, Chandler, AZ (US)

(73) Assignee: Dell Products L.P., Round Rock, TX (US)

( * ) Notice: Subject to any disclaimer, the term of this patent is extended or adjusted under 35 U.S.C. 154(b) by 185 days.

(21) Appl. No.: 12/357,928

(22) Filed: Jan. 22, 2009

(65) Prior Publication Data

US 2010/0182751 A1 Jul. 22, 2010

(51) Int. Cl.
*H05K 7/20* (2006.01)
*F28F 7/00* (2006.01)

(52) U.S. Cl. ... 361/697; 361/695; 361/710; 361/679.54; 165/80.3

(58) Field of Classification Search .......... 361/694–695, 361/697, 709–710, 679.54; 165/80.1–80.3, 165/185; 29/890.03, 890.039, 890.043
See application file for complete search history.

(56) References Cited

U.S. PATENT DOCUMENTS

| | | | |
|---|---|---|---|
| 6,161,610 A | 12/2000 | Azar | 165/80.3 |
| 6,400,577 B1 * | 6/2002 | Goodwin et al. | 361/816 |
| 2007/0215321 A1 * | 9/2007 | Yang et al. | 165/80.3 |
| 2009/0059525 A1 * | 3/2009 | Peng et al. | 361/697 |
| 2009/0154099 A1 * | 6/2009 | Li et al. | 361/697 |

OTHER PUBLICATIONS

Park et al., "Shape Optimization of a Plate for Type Heat Sink with Triangular-Shaped Vortex Generator", Ksme Int'l Journal, ISSN 1226-4865, 15 pages, 2004.

* cited by examiner

*Primary Examiner* — Zachary M Pape
(74) *Attorney, Agent, or Firm* — Baker Botts L.L.P.

(57) ABSTRACT

A system for removing heat from an electronic component associated with an information handling system is disclosed. The system may comprise a mass providing a heat sink to the electronic component and a set of extended surfaces for transferring heat from the mass. The set of extended surfaces may define a primary flow direction for a cooling fluid. A first subset of the set of extended surfaces may have a first length measured in the primary flow direction. A second subset of the set of extended surfaces may have a second length measured in the primary flow direction. Each of the first and second subsets of extended surfaces may include one or more extended surfaces. The second subset of extended surfaces may be generally proximate the hotspot of the electronic component. The second length may be less than the first length such that the flow rate of the cooling fluid through the second subset of extended surfaces is greater than a flow rate of the cooling fluid through the first subset of extended surfaces.

16 Claims, 3 Drawing Sheets

HEAT SINK INCLUDING EXTENDED SURFACES

TECHNICAL FIELD

The present disclosure relates in general to thermal management in relation to electronics components and more particularly to a heat sink for use in an information handling system.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

An information handling system may include one or more microprocessors or other electronic components configured to perform the functions of a central processing unit (CPU). One or more heat sinks may be associated with an electronic component to increase the effective thermal mass and heat dissipation associated with the component. Electronics designers and users may find that a better cooling rate allows increased operating speeds of the components so cooled. Some benefits of increased operating speeds may include, for example, an increase in how quickly and/or efficiently information may be processed, stored, and/or communicated.

SUMMARY

In accordance with one embodiment of the present disclosure, a system for removing heat from an electronic component associated with an information handling system is disclosed. The system may comprise a mass providing a heat sink to the electronic component and a set of extended surfaces for transferring heat from the mass. The set of extended surfaces may define a primary flow direction for a cooling fluid. A first subset of the set of extended surfaces may have a first length measured in the primary flow direction. A second subset of the set of extended surfaces may have a second length measured in the primary flow direction. Each of the first and second subsets of extended surfaces may include one or more extended surfaces. The second subset of extended surfaces may be generally proximate the hotspot of the electronic component. The second length may be less than the first length such that the flow rate of the cooling fluid through the second subset of extended surfaces is greater than a flow rate of the cooling fluid through the first subset of extended surfaces.

In accordance with a further embodiment of the present disclosure, a device associated with an information handling system is disclosed. The device may include an electronic component associated with the information handling system, the electronic component producing heat while in operation, a mass providing a heat sink to the electronic component, and a set of extended surfaces for transferring heat from the mass. The set of extended surfaces may define a primary flow direction for a cooling fluid. A first subset of the set of extended surfaces may have a first length measured in the primary flow direction. A second subset of the set of extended surfaces may have a second length measured in the primary flow direction. Each of the first and second subsets of extended surfaces may include one or more extended surfaces. The second subset of extended surfaces may be generally proximate the hotspot of the electronic component. The second length may be less than the first length such that a flow rate of the cooling fluid through the second subset of extended surfaces is greater than a flow rate of the cooling fluid through the first subset of extended surfaces.

In accordance with another embodiment of the present disclosure, an information handling system is disclosed. An information handling system may comprise a processor, a memory communicatively coupled to the processor, a mass providing a heat sink to the processor, and a set of extended surfaces for transferring heat from the mass. The set of extended surfaces may define a primary flow direction for a cooling fluid. A first subset of the set of extended surfaces may have a first length measured in the primary flow direction. A second subset of the set of extended surfaces may have a second length measured in the primary flow direction. Each of the first and second subsets of extended surfaces may include one or more extended surfaces. The second subset of extended surfaces may be generally proximate the hotspot of the electronic component. The second length may be less than the first length such that a flow rate of the cooling fluid through the second subset of extended surfaces is greater than a flow rate of the cooling fluid through the first subset of extended surfaces.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Preferred embodiments and their advantages are best understood by reference to FIGS. 1-6, wherein like numbers are used to indicate like and corresponding parts.

For the purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a PDA, a consumer electronic device, a network storage device, or any other suitable device and may vary in size, shape, performance, functionality, and price. The information handling system may include memory, one or more processing resources such as a central processing unit (CPU) or hardware or software control logic. Additional components or the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

The development of electronic components (e.g., hard disk drives) for use with information handling systems has resulted in increased performance in terms of data read/write speed, data capacity, and other metrics. In large part, these increases are supported by increased rotational speed of certain components (e.g., the platter of a hard disk drive). As a result of these increased speeds, the operation of such electronic components may generate increased heat loads.

In addition, improved electronic components may produce increased cooling loads in comparison to slower electronic components. Known methods for cooling electronic components may include passive cooling and/or active cooling with forced convection, for example. Active cooling may produce additional power consumption and/or noise generation in comparison to passive cooling solutions.

Figure 1:
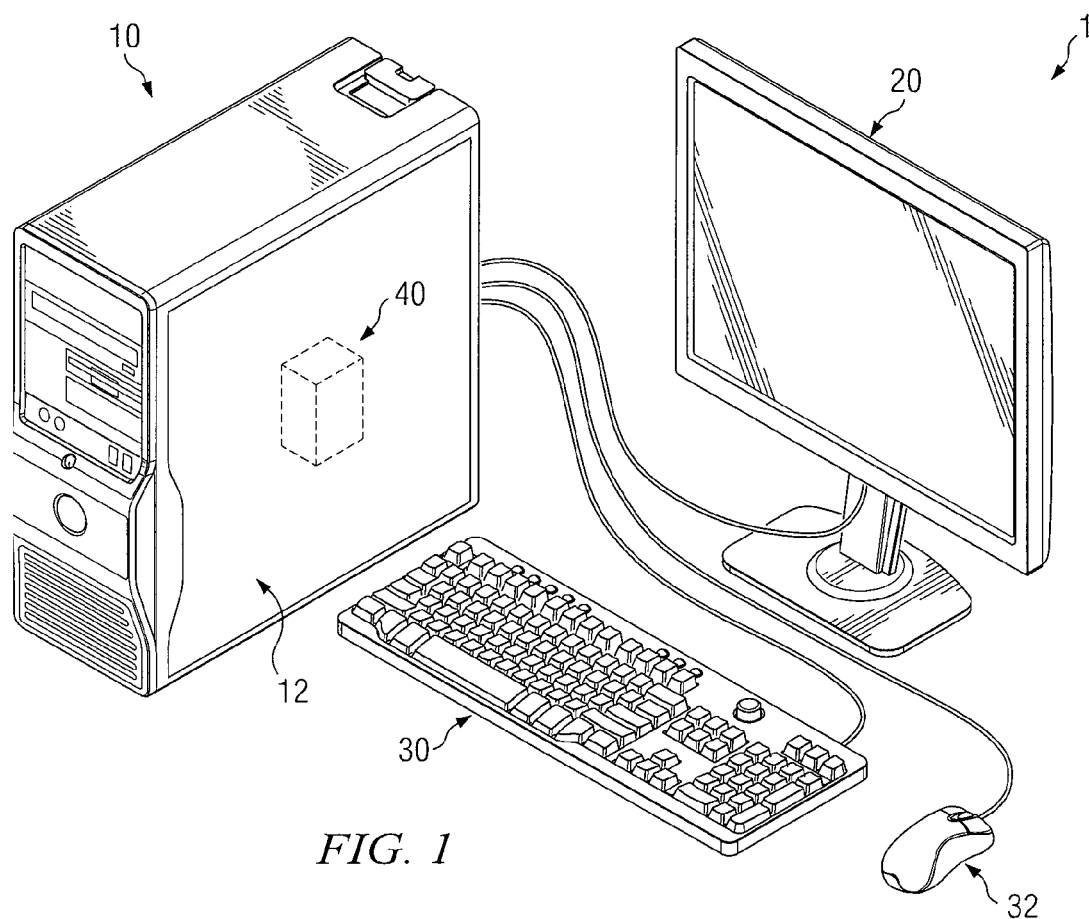
FIG. 1 illustrates an example information handling system in accordance with the present disclosure.

FIG. 1 depicts selected elements of an example information handling system 1 in accordance with the teachings of the present disclosure. Information handling system 1 may include a host 10, which may include electronic component 40. Electronic component 40 may include processing resources (e.g., one or more central processing units (CPUs)) and/or storage resources that are accessible to the processing resources in a housing 12. Storage resources may include volatile storage or memory and/or persistent storage, e.g., disk storage, flash memory or other type of erasable read only memory (ROM), and the like. Information handling system 1 may also include various other peripheral or I/O devices known in the field of data processing system design (e.g., display 20, keyboard 30, and mouse 32) shown in FIG. 1. Housing 12 may include any chassis, cabinet, tower, box, and/or enclosure appropriate for housing information handling system 1.

Figure 2:
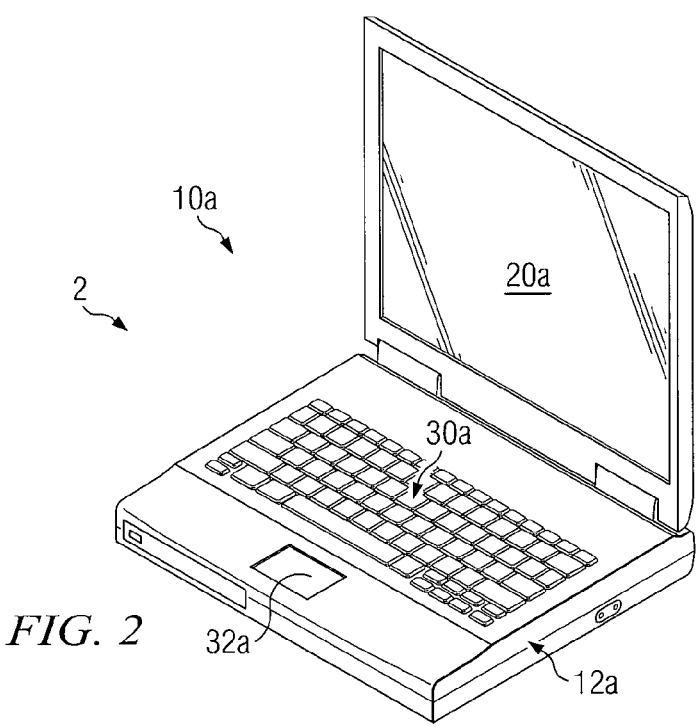
FIG. 2 illustrates another example information handling system in accordance with the present disclosure.

FIG. 2 depicts selected elements of an example information handling system 2 in accordance with teachings of the present disclosure. Information handling system 2 (also referred to as a laptop, notebook, or portable computer) may include features configured for portability, reduced weight, and/or compactness in comparison to a desktop computer (e.g., information handling system 1) or other information handling system. Information handling system 2 may include host 10a, housing 12a, display 20a, keyboard 30a, and/or touchpad 32a.

Figure 3:
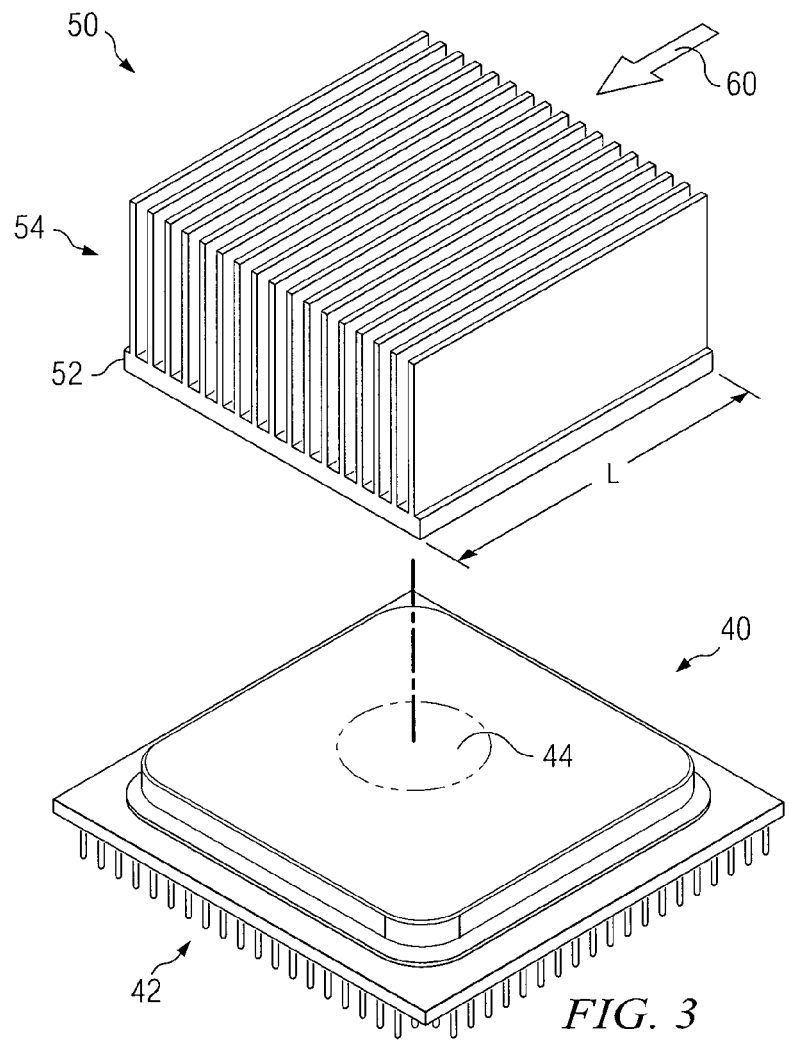
FIG. 3 illustrates an embodiment of a system for removing heat from an electronic component associated with an information handling system.

FIG. 3 illustrates selected aspects of an embodiment of a system for removing heat from an electronic component associated with an information handling system. The system of FIG. 3 may include and electronic component 40 and a heat sink 50. Electronic component 40 may include any device or component of an information handling system. For example, electronic component 40 may include processing resources (e.g., one or more central processing units, a graphics processing unit, and/or a digital signal processor), storage units (e.g., a hard disk drive, flash memory, etc.), and/or any device configured to control data, to process data, to convert electric power (e.g., sensors, transducers, and actuators), and/or to distribute electric power.

Electronic component 40 may include pins 42 and/a hotspot 44. Pins 42 may include any device or component configured to provide an electrical connection between electronic component 40 and the circuitry present on a board, as well as a physical connection between electronic component 40 and the board. For example, pins 42 may include a connector configured to attach electronic component 40 to a CPU socket and/or CPU slot. For example, pins 42 may be configured to plug into a known "socket 478", "socket T", or any of the many CPU sockets provided to interface with one or more available CPUs.

As another example, pins 42 may include a set of electrical connectors operable to connect circuitry of electronic component 40 to the circuitry of the board. For example, pins 42 may include a ball grid array. In some embodiments, pins 42 may include a fine ball grid array, a plastic ball grid array, a land grid array, a pin grid array, a dual in-line surface mount, and/or any other method of providing electrical connections between circuitry of information handling system 1 and electronic component 40.

Hotspot 44 may be any portion of electronic component 40 that experiences an increased temperature in comparison to other portions of electronic component 40. For example, as shown in FIG. 3, some electronic components 40 may produce a hotspot at the geometric center of electronic component 40. In other embodiments, hotspot 44 may have different locations. The location of hotspot 44 in any given embodiment may depend, at least in part, on the electronic circuitry in electronic component 40, the presence and/or location of any moving parts of electronic component 40 (e.g., the spindle of a hard disk drive), and/or any other feature of electronic component 40. In some embodiments, the location and/or existence of hotspot 44 may depend, at least in part, on the operation of electronic component 40 (e.g., in sleep mode, hibernation, overclocking of a CPU, etc.).

Heat sink 50 may include a mass 52 and a set of extended surfaces 54. Mass 52 may provide a heat sink to electronic component 40. Mass 52 may be formed from any appropriate material or component configured to increase heat transfer away from electronic component 40. For example, mass 52 may serve to increase the heat dissipation associated with electronic component 40. Mass 52 may include material with relatively high thermal conductivity (e.g., a metal block or aluminum and/or copper alloy). Mass 52 may be fabricated and/or shaped in any manner to facilitate heat transfer between electronic component 40 and mass 52 and/or to facilitate mounting mass 52 to electronic component 40 and/or a transition device. For example, there may a gap pad mounted between mass 52 and electronic component 40. A gap pad may include a thermal interface between electronic component 40 and mass 52.

A gap pad may include any thermal interface material providing conformability, high thermal conductivity, and/or easy installation or application. Embodiments including a gap pad may eliminate air gaps between electronic component 40 and mass 52 whether due to uneven surface topography and/or rough surface textures. In some embodiments, a gap pad may be disposed to be directly above hot spot 44 of electronic component 40 (e.g., a platter of a hard disk drive).

Extended surfaces 54 may include any component or feature of heat sink 50 configured to increase heat transfer from mass 52 to the environment. Extended surfaces 54 may serve to increase the surface area of heat sink 50 and/or mass 52 and, therefore, increase the rate of heat transfer through convection, conduction, and/or radiation between mass 52 and the environment. Although the embodiment shown in FIG. 3 includes long, thin fins, extended surfaces 54 may include any physical features or characteristics (e.g., extrusions, folds, and/or stacked fins) that increase the surface area-to-volume ratio of heat sink 50 and/or mass 52. Like mass 52, extended surfaces 54 may also be made of any material with relatively high thermal conductivity (e.g., aluminum and/or copper alloy).

In embodiments such as that shown in FIG. 3, heat sink 50, mass 52, and/or extended surfaces 54 may provide sufficient thermal dissipation for the operation of electronic component 40 to eliminate the need for active cooling components (e.g., fans, liquid coolant, etc.). In other embodiments, heat sink 50 may be configured for use with liquid cooling systems to increase the cooling capacity of an associated information handling system.

As shown in FIG. 3, set of extended surfaces 54 may define a primary flow direction, shown by arrow 60. Any cooling fluid (e.g., air, water, and/or another coolant) may pass between extended surfaces 54 to facilitate cooling (e.g., conduction, convection, and/or radiation). Extended surfaces 54 may have a length, L, measured in the primary flow direction (shown by arrow 60).

In some applications, the cooling fluid may impinge extended surfaces 54 generally parallel with the primary flow direction shown by arrow 60. If the set of extended surfaces 54 are all uniform, like that set shown in FIG. 3, the velocity and mass flow rate of the cooling fluids across extended surfaces 54 may be uniform. The heat transfer from electronic component 40, mass 52, and/or extended surfaces 54 may depend, at least in part, on the velocity of the cooling fluid, the specific heat of the cooling fluid, the surface area of extended surfaces 54, and/or the temperature difference between the cooling fluids and electronic component 40, mass 52, and/or extended surfaces 54. In general, as the velocity of the cooling fluid increases, the effective heat transfer rate will also increase.

Figure 4A:
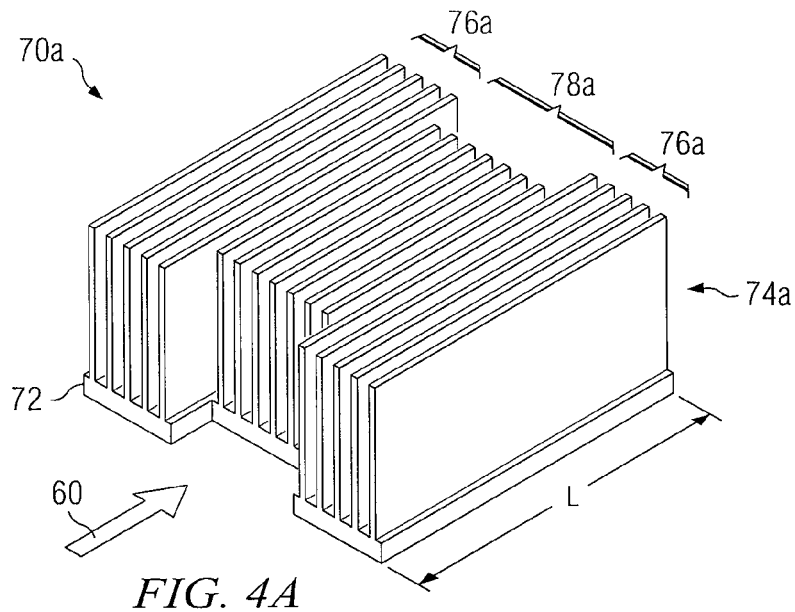
FIGS. 4A and 4B illustrate an embodiment of a system for removing heat from an electronic component associated with an information handling system in accordance with the present disclosure.
Figure 4B:
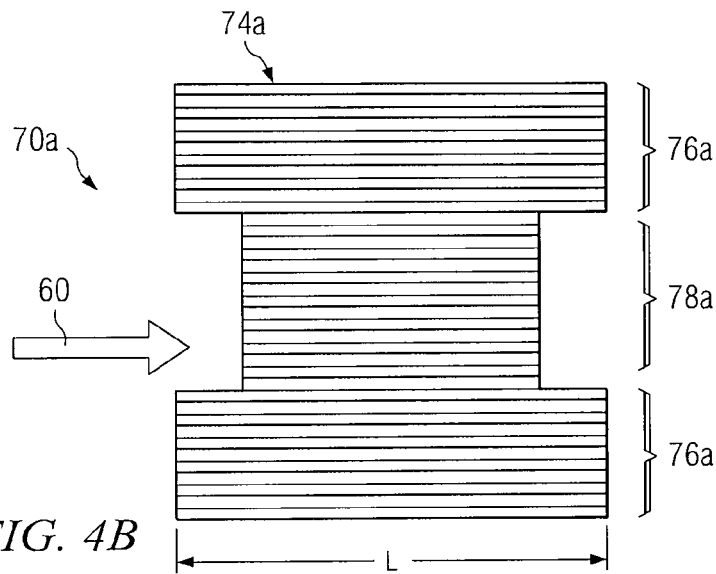
Figure 5:
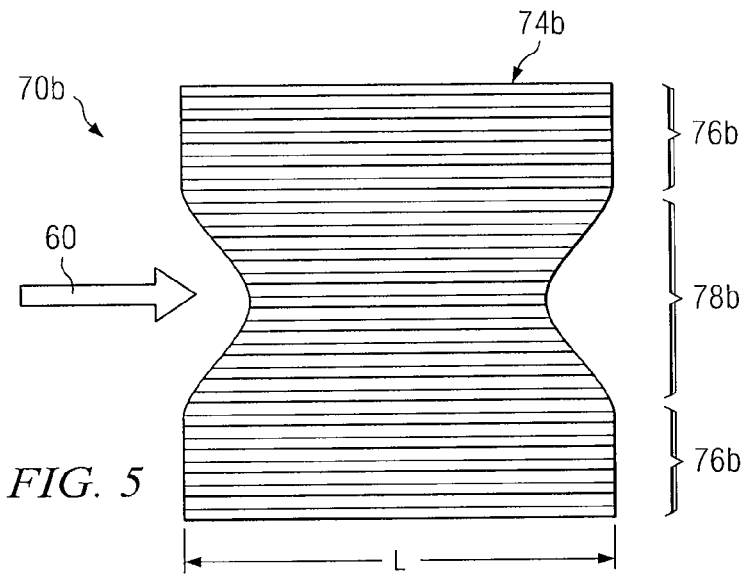
FIG. 5 illustrates an embodiment of a system for removing heat from an electronic component associated with an information handling system in accordance with the present disclosure.
Figure 6:
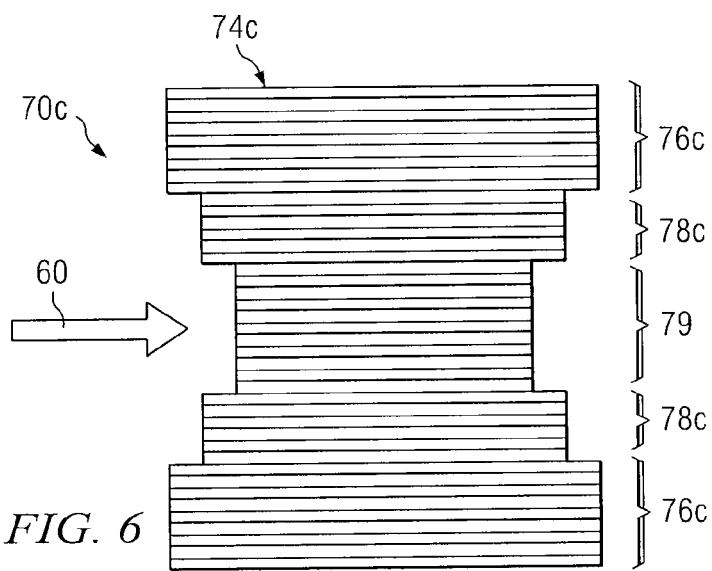
FIG. 6 illustrates an embodiment of a system for removing heat from an electronic component associated with an information handling system in accordance with the present disclosure.

FIGS. 4-6 illustrate various embodiments of a heat sink 70 for removing heat from an electronic component associated with an information handling system in accordance with the present disclosure. Heat sink 70 may include a mass 70 and a set of extended surfaces 74. Mass 72 may provide a heat sink to electronic component 40. Mass 72 may be formed from any appropriate material or component configured to increase heat transfer away from electronic component 40. For example, mass 72 may serve to increase the heat dissipation associated with electronic component 40. Mass 72 may include material with relatively high thermal conductivity (e.g., a metal block or aluminum and/or copper alloy). Mass 72 may be fabricated and/or shaped in any manner to facilitate heat transfer between electronic component 40 and mass 72 and/or to facilitate mounting mass 72 to electronic component 40 and/or a transition device. For example, there may a gap pad mounted between mass 72 and electronic component 40. A gap pad may include a thermal interface between electronic component 40 and mass 72.

As shown in FIG. 4A, set of extended surfaces 74a may define a primary flow direction, shown by arrow 60. Any cooling fluid (e.g., air, water, and/or another coolant) may pass between extended surfaces 74a to facilitate cooling (e.g., conduction, convection, and/or radiation). Extended surfaces 74a may have a length, L, measured in the primary flow direction (shown by arrow 60).

Set of extended surfaces 74 may include a first subset of extended surfaces 76 having a first length measured in the primary flow direction indicated by arrow 60. Set of extended surfaces 74 may include a second subset of extended surfaces 78 having a second length measured in the primary flow direction indicated by arrow 60. Each of the first and second subsets of extended surfaces may include one or more extended surfaces. As shown in FIGS. 4-6, the second length (length of second subset of extended surfaces 78) may be less than the first length (length of first subset of extended surfaces 76).

FIGS. 4A and 4B illustrate an embodiment of heat sink 70a for removing heat from an electronic component associated with an information handling system in accordance with the present disclosure. As shown in FIGS. 4A and 4B, first subset of extended surfaces 76a has a first length, L, measured in the primary flow direction indicated by arrow 60. Second subset of extended surfaces 78a has a second length measured in the primary flow direction indicated by arrow 60. As shown in FIGS. 4A and 4B, second subset of extended surfaces 78a may be located in the relative center of heat sink 70. Because the second length is shorter than the first length, the flow rate of any cooling fluid through second subset of extended surfaces 78a may be increased in comparison to the flow rate of any cooling fluid through first subset of extended surfaces 76a.

As the length of a subset of extended surfaces is reduced, the relative flow rate through the same subset of extended surfaces may increase. As the relative flow rate increases, the overall heat transfer coefficient may increase. It should be noted, however, that the reduction of the length of a subset of extended surfaces also reduces the surface area of the same subset of extended surfaces. An increase in heat transfer coefficient and a reduction in surface area provide opposing effects on the total heat transfer from heat sink 70 and, therefore, electronic component 40. A person having ordinary skill in the art, using the teachings of the present disclosure, will be able to iterate a design of the first and second subset of extended surfaces to optimize the balance between the increase in flow rate of the coolant and the loss of surface area of the extended surfaces 74.

FIGS. 5 and 6 illustrate additional embodiments of heat sink 70 for removing heat from an electronic component associated with an information handling system in accordance with the present disclosure. FIG. 5 shows a heat sink 70b in which extended surfaces 74b include a first subset of extended surfaces 76b with a first length, L, measured in the primary flow direction of a cooling fluid. Heat sink 70b includes a second subset of extended surfaces 78b with a varying length measured in the primary flow direction of the cooling fluid. Heat sink 70b may be used if hotspot 44 (discussed in relation to FIG. 3) does not have a uniform temperature.

FIG. 6 shows a heat sink 70c with three subsets of extended surfaces 76c, 78c, and 79. In the same way that the lengths of first subset of extended surfaces 76 and second subset of extended surfaces 78c can be balanced to optimize the total heat transfer from heat sink 70 and electronic component 40, a third subset of extended surfaces 79 may allow further optimization. If hotspot 44 (discussed in relation to FIG. 3) is spread over a large portion of electronic component 40, and/or has a hotter hotspot at the center, the configuration shown in FIG. 6 may provide additional optimization.

While the present disclosure includes reference to hard disk drives, the teachings herein are applicable to any electronic component, especially those with rotating components. Although the present disclosure has been described in detail, it should be understood that various changes, substitutions, and alterations can be made hereto without departing from the spirit and the scope of the disclosure as defined by the appended claims.

What is claimed is:

1. A system for removing heat from an electronic component associated with an information handling system, the electronic component having a hotspot, the system comprising:
   a mass providing a heat sink to the electronic component;
   a set of extended surfaces for transferring heat from the mass;
   the set of extended surfaces defining a primary flow direction for a cooling fluid;
   a first subset of the set of extended surfaces having a first length measured in the primary flow direction;
   a second subset of the set of extended surfaces having a second length measured in the primary flow direction;
   each of the first and second subsets of extended surfaces including one or more extended surfaces; and
   the second subset of extended surfaces disposed closer to the hotspot of the electronic component than any other subset of the set of extended surfaces;
   wherein the second length is less than the first length such that a flow rate of the cooling fluid through the second subset of extended surfaces is greater than a flow rate of the cooling fluid through the first subset of extended surfaces.

2. A system according to claim 1, wherein the second length optimizes an increase in heat transfer coefficient and decrease in total surface area.

3. A system according to claim 1, further comprising a third subset of the set of extended surfaces having a third length measured in the primary flow direction;
   wherein the third length is less than the first length such that a flow rate of the cooling fluid through the third subset of extended surfaces is greater than the flow rate of the cooling fluid through the first subset of extended surfaces; and
   wherein the third length is greater than the second length such that the flow rate of the cooling fluid through the third subset of extended surfaces is less than the flow rate of the cooling fluid through the second subset of extended surfaces.

4. A system according to claim 1, wherein the electronic component comprises a CPU.

5. A system according to claim 1, wherein the electronic component comprises a memory device.

6. A device for improving the performance of an information handling system, the device comprising:
   an electronic component associated with the information handling system, the electronic component producing heat while in operation;
   a mass providing a heat sink to the electronic component;
   a set of extended surfaces for transferring heat from the mass;
   the set of extended surfaces defining a primary flow direction for a cooling fluid;
   a first subset of the set of extended surfaces having a first length measured in the primary flow direction;
   a second subset of the set of extended surfaces having a second length measured in the primary flow direction;
   each of the first and second subsets of extended surfaces including one or more extended surfaces; and
   the second subset of extended surfaces disposed closer to the hotspot of the electronic component than any other subset of the set of extended surfaces;
   wherein the second length is less than the first length such that a flow rate of the cooling fluid through the second subset of extended surfaces is greater than a flow rate of the cooling fluid through the first subset of extended surfaces.

7. A device according to claim 6, wherein the second length optimizes an increase in heat transfer coefficient and decrease in total surface area.

8. A device according to claim 6, further comprising a third subset of the set of extended surfaces having a third length measured in the primary flow direction;
   wherein the third length is less than the first length such that a flow rate of the cooling fluid through the third subset of extended surfaces is greater than the flow rate of the cooling fluid through the first subset of extended surfaces; and
   wherein the third length is greater than the second length such that the flow rate of the cooling fluid through the third subset of extended surfaces is less than the flow rate of the cooling fluid through the second subset of extended surfaces.

9. A device according to claim 6, wherein the electronic component comprises a CPU.

10. A device according to claim 6, wherein the electronic component comprises a hard disk drive.

11. A device according to claim 6, wherein the electronic component comprises a digital signal processor.

12. A device according to claim 6, wherein the electronic component comprises a graphics processing unit.

13. A device according to claim 6, further comprising a fan operable to impel the cooling fluid across the set of extended surfaces.

14. An information handling system comprising:
   a processor;
   a memory communicatively coupled to the processor;
   a mass providing a heat sink to the processor;
   a set of extended surfaces for transferring heat from the mass;
   the set of extended surfaces defining a primary flow direction for a cooling fluid;
   a first subset of the set of extended surfaces having a first length measured in the primary flow direction;
   a second subset of the set of extended surfaces having a second length measured in the primary flow direction;
   each of the first and second subsets of extended surfaces including one or more extended surfaces; and
   the second subset of extended surfaces disposed closer to the hotspot of the electronic component than any other subset of the set of extended surfaces;
   wherein the second length is less than the first length such that a flow rate of the cooling fluid through the second subset of extended surfaces is greater than a flow rate of the cooling fluid through the first subset of extended surfaces.

15. A system according to claim 14, wherein the second length optimizes an increase in heat transfer cofficient and decrease in total surface area.

16. A system according to claim 14, further comprising a third subset of the set of extended surfaces having a third length measured in the primary flow direction;

wherein the third length is less than the first length such that a flow rate of the cooling fluid through the third subset of extended surfaces is greater than the flow rate of the cooling fluid through the first subset of extended surfaces; and wherein the third length is greater than the second length such that the flow rate of the cooling fluid through the third subset of extended surfaces is less than the flow rate of the cooling fluid through the second subset of extended surfaces.

* * * * *